United States Patent
Furukawa et al.

(10) Patent No.: US 7,642,609 B2
(45) Date of Patent: Jan. 5, 2010

(54) METAL-OXIDE-SEMICONDUCTOR DEVICE WITH A DOPED TITANATE BODY

(75) Inventors: Yukiko Furukawa, Veldhoven (NL); Vincent Venezia, Sunnyvale, CA (US); Radu Surdeanu, Heverlee (BE)

(73) Assignee: NXP B.V., Eindhoven (NL)

( * ) Notice: Subject to any disclaimer, the term of this patent is extended or adjusted under 35 U.S.C. 154(b) by 340 days.

(21) Appl. No.: 11/577,707

(22) PCT Filed: Oct. 19, 2005

(86) PCT No.: PCT/IB2005/053425

§ 371 (c)(1), (2), (4) Date: Apr. 20, 2007

(87) PCT Pub. No.: WO2006/043243

PCT Pub. Date: Apr. 27, 2006

(65) Prior Publication Data
US 2009/0065875 A1    Mar. 12, 2009

(30) Foreign Application Priority Data
Oct. 21, 2004    (GB) .................................. 0423343.3

(51) Int. Cl.
H01L 29/78    (2006.01)
H01L 21/22    (2006.01)

(52) U.S. Cl. ............... 257/410; 257/288; 257/E29.255; 257/E21.135; 438/195; 438/285; 438/257

(58) Field of Classification Search ....................... None
See application file for complete search history.

(56) References Cited

U.S. PATENT DOCUMENTS 5,760,432 A    6/1998    Abe et al.

OTHER PUBLICATIONS

"Thin-Film Field-Effect Transistors Based on LA-Doped SRTIO3 Heterostructures", Pan F et al, Applied Physics Letters, AIP, American Institute of Physics, Melville, NY, US, Mar. 1, 2004.

*Primary Examiner*—Victor A Mandala
*Assistant Examiner*—Whitney Moore

(57) ABSTRACT

A metal-oxide-semiconductor (MOS) device having a body of single-crystal strontium titanate or barium titanate (10) is provided in which the body comprises a doped semiconductor region (24) adjacent a dielectric region (26). The body may further comprise a doped conductive region separated from the semiconductor region by the dielectric region. The material characteristics of single-crystal strontium titanate when doped in various ways are exploited to provide the insulating, conducting and semiconducting components of a MOS stack. Advantageously, the use of a single body avoids the presence of interface layers between the stack components which improves the characteristics of MOS devices such as field effect transistors.

14 Claims, 3 Drawing Sheets

METAL-OXIDE-SEMICONDUCTOR DEVICE WITH A DOPED TITANATE BODY

Figure 1:
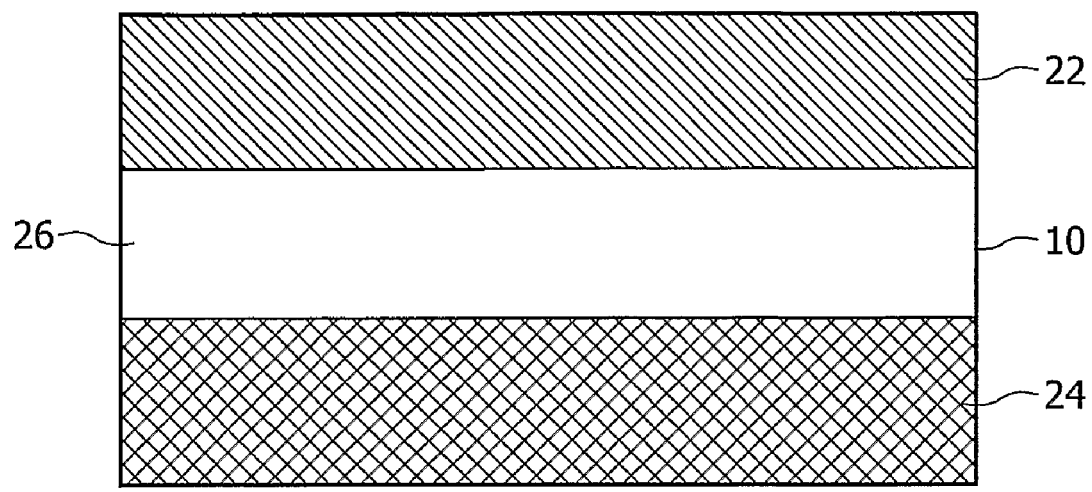

The invention relates to a metal-oxide-semiconductor (MOS) device having a doped semiconductor region adjacent a dielectric region.

A MOS device comprises an insulating dielectric region which separates a semiconductive region from a conductive region. Examples of such devices include field effect transistors (MOSFETs), FRAM, DRAM, and LDMOS devices. In a MOSFET the semiconductive region provides a channel through which a current flows, and the conductive region serves as a gate. The current is controlled by voltage signals applied to the gate. The gate, dielectric and semiconductor regions are commonly formed in a sequence of layers and collectively referred to as the gate stack.

The dielectric, or gate dielectric, serves to electrically insulate the semiconductor from the conductive gate. In order to prevent an excessive tunnelling current, or leakage current, the gate dielectric must be sufficiently thick. The minimum practical thickness of the dielectric is determined by the dielectric constant, k, of the material used. A gate dielectric must be sufficiently thick to ensure acceptable leakage currents.

The desire for smaller and more compact electronic devices in today's electronics market presents the challenge to manufacturers to provide smaller and more compact integrated circuit components. For example, MOSFETs having a smaller gate width are desired. In order to maintain a sufficient gate capacitance, however, to operate efficiently, "High-k" gate dielectrics are employed. This allows an increase is the thickness of the gate dielectric, where a smaller gate width is used, while maintaining a sufficient gate capacitance.

The term "high-k dielectric" is used for dielectrics having a dielectric constant greater than 3.9 which is the k-value for $SiO_2$, a material commonly used for dielectrics in MOS devices and storage capacitors. An example high-k dielectric is $SrTiO_3$, or strontium titanate.

A paper by Pan et al, Appl Phys Letts, vol. 84, No. 9, pp. 1573-1575, entitled "Thin-film field-effect transistors based on La-doped $SrTiO_3$ heterostructures" discloses a FET fabricated using $SrTiO_3$ as the insulating gate and lanthanum-doped $SrTiO_3$ as an n-type buried semiconducting channel. Epitaxial heterostructures are grown on a substrate in sequence to form the gate stack. Firstly, a semiconducting layer of lanthanum-doped $SrTiO_3$ is grown on the substrate. Lanthanum is a rare-earth element which serves as a substitutional dopant on the strontium site. The doped material demonstrates semiconductor properties. Secondly, the gate insulator layer of $SrTiO_3$ is grown. Thirdly, metal contacts are deposited using a thermal evaporation system and lift-off technique and then patterned to define the gate and gate contacts.

The epitaxial deposition of $SrTiO_3$ is a slow and relatively difficult process. This would be expensive to introduce to mass-production of CMOS devices and, therefore, inhibits the use of $SrTiO_3$ in large-scale CMOS processing.

According to a first aspect of the present invention there is provided a metal-oxide-semiconductor (MOS) device having a body of single-crystal strontium titanate or barium titanate, the body comprising a doped semiconductor region adjacent a dielectric region. The gate dielectric and semiconductor of a MOS device are provided by a single-crystal body thereby avoiding the presence of interface layers between these component layers. Advantageously, this maintains the material properties of the MOS structure and improves device performance.

The present invention includes the recognition by the inventors that a body of single-crystal strontium titanate or barium titanate can be doped in such a way to provide both insulating and semiconducting regions.

In a preferred embodiment, the body further comprises a doped conductive region separated from the semiconductor region by the dielectric region. The inventors have further recognised that single crystal strontium titanate and barium titanate, especially the former, can be processed in such a way so as to make the material conductive. This valuable characteristic is exploited so as to provide a gate stack having no interface layers. A single crystal therefore, serves to provide the gate, gate dielectric and semiconductor regions of a MOS device. Advantageously, local differences in crystal orientation associated with metal gate electrodes are avoided thereby improving the uniformity of the work function.

It should be appreciated that the terms strontium titanate and barium titanate should be interpreted to include derivatives thereof. For example, a small proportion of the barium sites in a single crystal of barium titanate may be occupied by other elements to give single crystals of $(Ba,Sr)TiO_3$, $(Ba,Ca)TiO_3$ or $(Ba,Pb)TiO_3$. Also, a proportion of the titanium sites may be occupied by tin or zirconium to give $Ba(Ti,Sn)O_3$, or $Ba(Ti,Zr)O_3$ for example.

The conductive region and/or the semiconductor region are preferably doped with at least one rare earth ion such as La, or it's oxide. Other alternatives include Nd, Ho, Dy, Sm, Pr, Gd, Nb and Ta.

According to a second aspect of the present invention there is provided a method of manufacturing a metal-oxide-semiconductor (MOS) device comprising a semiconductor region separated from a conductive region by a dielectric region, the method comprising doping a first surface of a body of single-crystal strontium titanate or barium titanate with a rare-earth oxide to a first concentration to form a semiconductor region adjacent an insulating region of the body which forms the dielectric region.

By avoiding epitaxial deposition, the fabrication of the semiconductor region and dielectric region requires fewer process steps. Advantageously, this reduces manufacturing costs and provides a practical route to realising mass-production of electronic devices which incorporate high-k dielectrics.

In a preferred embodiment the method further comprises doping an opposing second surface of the body with a rare-earth oxide to a second concentration which is greater than the first concentration, and then, annealing and reducing the second surface to form the conductive region which is separated from the semiconductor region by the dielectric region. This allows the fabrication of the semiconductor region, the dielectric and the conductive region without any epitaxial deposition thereby advantageously reducing further the number of process steps required.

The second surface may be annealed and reduced by depositing a reducing material over the second surface and heating the surface in air. Alternatively, the second surface may be annealed and reduced by heating the second surface in a reducing atmosphere. In this case, the first surface may be protected by covering with an oxide layer during annealing and/or a local rapid thermal anneal using a layer may be used to heat the second surface. This serves to prevent reduction of the first surface. The reducing atmosphere may, for example, comprise $N_2$ and/or $H_2$ gas.

The invention will now be described, by way of example only, with reference to the accompanying drawings wherein, FIG. 1 is a highly schematic sectional view of part of a field effect transistor according to the invention; and FIGS. 2A-2E are schematic sectional views of a MOS device at various stages during manufacture in accordance with the invention.

The invention will be described in relation to a MOSFET. However, it should be recognised that this is merely one example of a MOS device and that the invention is equally applicable to other MOS devices such as those described in the introduction.

A MOSFET comprises a gate stack having a conductive gate region over a gate dielectric region over a semiconductor region. Electrical gate signals in the form of voltages applied to the gate region serve to control an electrical current which flows through a channel in the semiconductor region. The gate dielectric serves to electrically insulate the gate region from the underlying channel.

FIG. 1 shows a gate stack 10 formed from a body of single-crystal strontium titanate. It should be appreciated that the Figure is schematic and shows only part of a MOSFET. For simplicity and ease of understanding, other components such as the source and drain electrodes are not shown in this figure. Although the body described in the following embodiment is formed of single crystal strontium titanate, it will be appreciated that barium titanate or derivatives of strontium titanate or barium titanate may be used instead. For example, single crystal $(Ba,Sr)TiO_3$, $(Ba,Ca)TiO_3$, $(Ba,Pb)TiO_3$, $Ba(Ti,Sn)O_3$, or $Ba(Ti,Zr)O_3$ may be used.

The body of single-crystal strontium titanate comprises a doped conductive gate region 22 and a doped semiconductor region 24 separated by a gate dielectric region 26. Electrical connections made to these component regions are not shown.

With reference to FIGS. 2A to 2E, an example method of manufacturing a device in accordance with the invention will now be described.

Figure 2A:
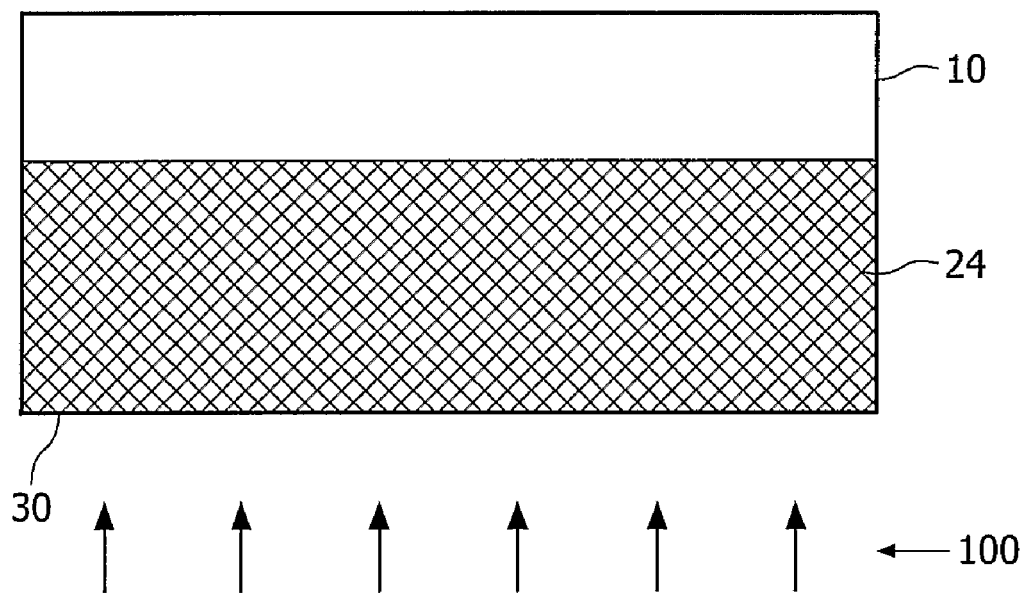

The gate stack is fabricated by processing a wafer or thin square plate of raw single-crystal strontium titanate. The wafer is supported on a sample holder (not shown). Firstly, as shown in FIG. 2A, a first major surface 30 (the backside) of the wafer is implanted with lanthanum ions using a La or $La_2O_3$ source, as indicated by 100. Other rare-earths and their oxides may instead be used including Nd, Ho, Dy, Sm, Pr, Gd, Nb and Ta. Alternatively, Sn or Ce can be used to implant the wafer. A part of the implanted region 24 will form the semiconductive channel of the final device. Following implantation of the ions into surface 30, a protective layer of $SiO_2$ (not shown) for example may be deposited thereover.

Figure 2B:
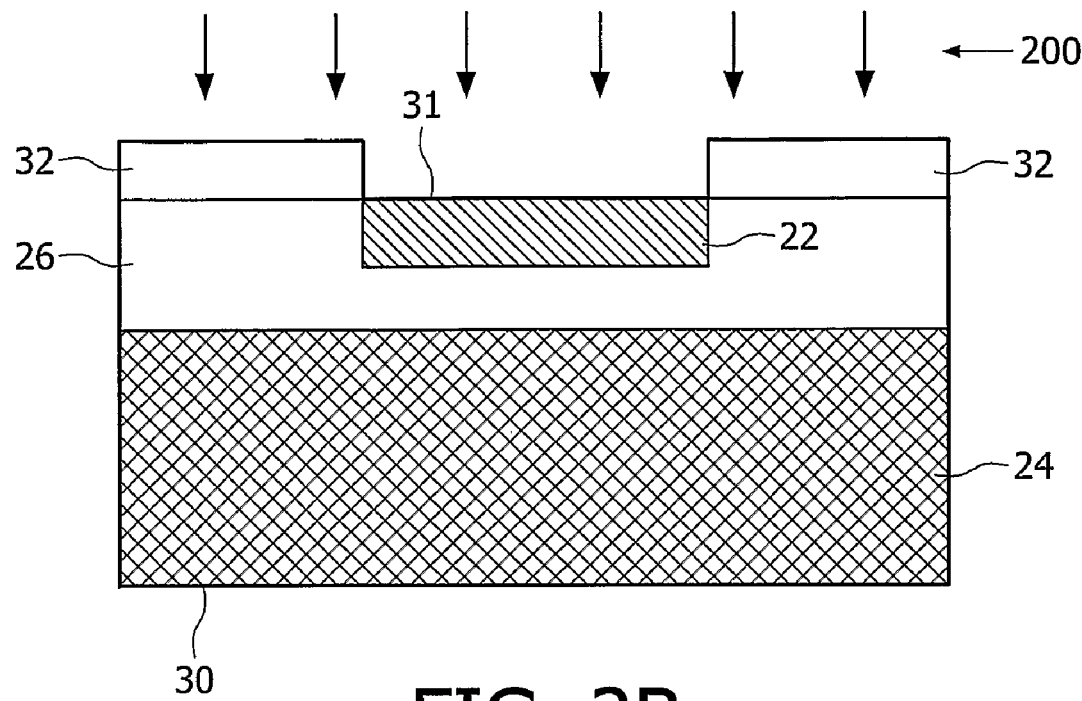

A layer of photoresist is then deposited on a second major surface 31 opposing the first major surface 30. Portions of the photoresist are then exposed to UV radiation and a wet etch is used to remove a portion of the resist so as to leave photo resist portions 32 which serve as a mask as shown in FIG. 2B. It should be appreciated, however, that other known techniques can be exploited to form the mask 32. Lanthanum ions are then implanted, as referenced at 200, into the exposed part of the second major surface 31 of the wafer, to a predetermined depth in the range of 50-300 nm depending on the dopant used. The doping concentration applied to the second surface 31 is greater than that applied to the first surface 30. For example, the doping concentration applied to the first surface 30 (for the semiconductor region) may be less than 0.15 mol %, whereas, the doping concentration applied to the second surface 31 may be within the range of 0.15-0.25 mol %. The second implanted region 22 will form the conductive gate of the final device, the gate being separated from the semiconductive channel 24 by an insulating (dielectric) region 26.

The rare earth dopants within the gate region 22 are then activated by heating and (chemically) reducing the region. The effects of this process should be limited to the gate region only so as to avoid significantly changing the conductivity of the underlying dielectric region 26. The gate region 22 can be annealed and reduced by heating the second surface in a reducing atmosphere such as an $N_2$—$H_2$ mixture. The exposed surfaces of the other regions can be covered by an oxide layer to prevent reduction thereof. To ensure that only the second surface is reduced, a local flash rapid thermal anneal (RTA) can be employed, for example, using a laser.

Alternatively, a layer of silicon nitride (not shown) is deposited selectively over the highly doped gate region 22. The wafer is then annealed in air by heating to a temperature of >1000° C. for a duration of 1 minute to 1 hour depending on the dopant and the body material. The layer of silicon nitride serves to reduce only the gate region 22 during the annealing step. Other reducing materials may be used instead, however, such as titanium nitride and aluminium nitride for example.

Figure 2C:
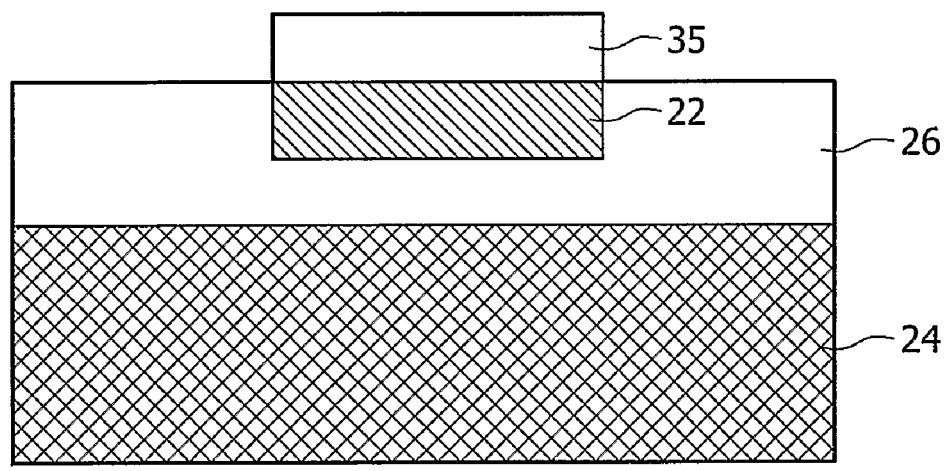

With reference to FIG. 2C, a protective layer 35 of, for example, $Si_3N_4$, AlN or TiN is then deposited over the wafer, and the photoresist portions 32 are removed leaving a nitride hard mask 35 over the activated conductive gate region 22.

Figure 2D:
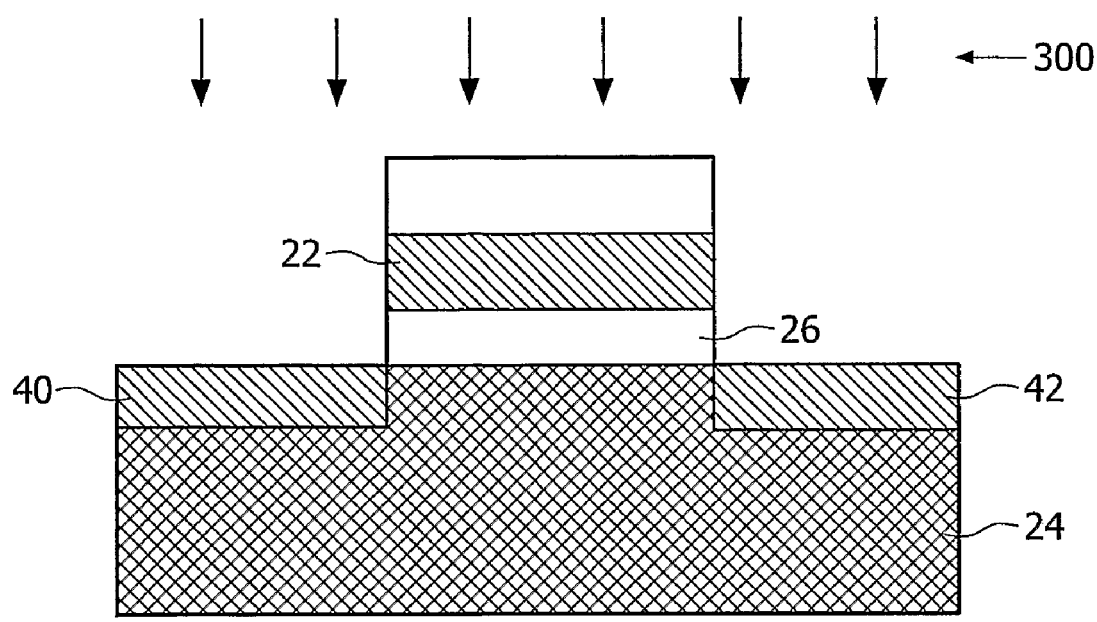
Figure 2E:
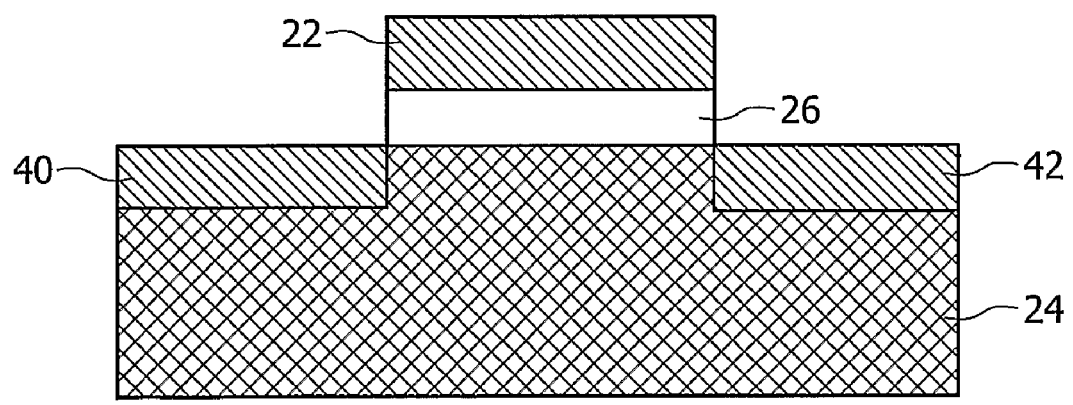

The exposed surface of the wafer is then etched so as to remove portions of the undoped material down to the boundary of the semiconductive region 24, as shown in FIG. 2D. Source and drain regions 40, 42 are then formed by implanting dopant species 300 into the now-exposed surface of the semiconductive region of the wafer. The dopant ions are then activated by a thermal anneal. The hard mask 35 is then removed, leaving the MOS device as shown in FIG. 2E.

It should be appreciated that the source and drain regions can be formed in a number of different ways and employing a variety of known n-type and p-type dopant species. However, the source/drain formation is not critical to the device and method of the invention and the details thereof will not be discussed further.

Although the gate stack has been described in isolation, it should be appreciated that a MOSFET having such a gate stack can be incorporated into many different applications, an integrated circuit chip for example.

The invention includes the recognition that single-crystal strontium titanate or barium titanate can be doped to provide a semiconductor region adjacent a dielectric region. Therefore, although the single-crystal body in the above-described embodiment also comprises a conductive region, it should be appreciated that this is not essential for a MOS device in accordance with the invention. For example, a MOS device having a body of single-crystal barium titanate which provides the semiconductive and dielectric regions, and a epitaxially formed conductive region, falls within the scope of the present invention.

In summary there is provided a MOS device having a body of single-crystal strontium titanate or barium titanate in which the body comprises a doped semiconductor region adjacent a dielectric region. The body may further comprise a doped conductive region separated from the semiconductor region by the dielectric region. The material characteristics of single-crystal strontium titanate when doped in various ways are exploited to provide the insulating, conducting and semi-conducting components of a MOS stack. Advantageously, the use of a single body avoids the presence of interface layers between the stack components which improves the characteristics of MOS devices such as field effect transistors.

From reading the present disclosure, other variations and modifications will be apparent to persons skilled in the art. Such variations and modifications may involve equivalent and other features which are already known in the design, manufacture and use of semiconductors and which may be used in addition to or instead of features described herein.

The invention claimed is:

1. A metal-oxide-semiconductor (MOS) device comprising a body of single-crystal strontium titanate or barium titanate, the single crystal strontium titanate or barium titanate including a doped semiconductor region and a dielectric region,
wherein the semiconductor region is doped with at least one rare earth oxide.

2. A MOS device according to claim 1, wherein the rare earth oxide is $La_2O_3$.

3. A MOS device according to any preceding claim, wherein the single crystal strontium titanate or barium titanate-further includes a doped conductive region separated from the semiconductor region by the dielectric region.

4. A field effect transistor comprising a MOS device according to claim 3, wherein the conductive region serves as a gate, the dielectric region serves as a gate dielectric and the semiconductor region comprises a conduction channel.

5. A method of manufacturing a metal-oxide-semiconductor (MOS) device comprising a body of single-crystal strontium titanate or barium titanate including a semiconductor region and a dielectric region, the method comprising doping a first surface of the body of single-crystal strontium titanate or barium titanate with a rare-earth oxide to a first concentration to form the semiconductor region adjacent an insulating region of the body which forms the dielectric region.

6. A method according to claim 5, further comprising doping an opposing second surface of the body with a rare-earth oxide to a second concentration which is greater than the first concentration, and then, annealing and reducing the second surface to form the conductive region which is separated from the semiconductor region by the dielectric region.

7. A method of manufacturing a MOS device according to claim 6, wherein the second surface is annealed and reduced by depositing a reducing material over the second surface and heating the surface in air.

8. A method of manufacturing a MOS device according to claim 6, wherein the second surface is annealed and reduced by heating the second surface in a reducing atmosphere.

9. A method of manufacturing a MOS device according to claim 8, wherein the first surface is covered with an oxide layer during annealing.

10. A method of manufacturing a MOS device according to claim 9, wherein the second surface is heated by a local rapid thermal anneal using a laser.

11. A method of manufacturing a MOS device according to claim 9, wherein the reducing atmosphere comprises at least one of the following: $N_2$ or $H_2$ gas.

12. A method of manufacturing a MOS device according to claim 8, wherein the second surface is heated by a local rapid thermal anneal using a laser.

13. A method of manufacturing a MOS device according to claim 12, wherein the reducing atmosphere comprises at least one of the following: $N_2$ or $H_2$ gas.

14. A method of manufacturing a MOS device according to claim 8, wherein the reducing atmosphere comprises at least one of the following: $N_2$ or $H_2$ gas.

* * * * *